United States Patent [19]

Nagamine et al.

[11] Patent Number: 5,319,246
[45] Date of Patent: Jun. 7, 1994

[54] SEMICONDUCTOR DEVICE HAVING MULTI-LAYER FILM STRUCTURE

[75] Inventors: Takako Nagamine; Katuhiko Tamura; Toru Koyama, all of Hyogo, Japan

[73] Assignee: Mitsubishi Denki Kabushiki Kaisha, Tokyo, Japan

[21] Appl. No.: 937,453

[22] Filed: Aug. 31, 1992

Related U.S. Application Data

[63] Continuation of Ser. No. 578,986, Sep. 7, 1990, abandoned.

[30] Foreign Application Priority Data

Nov. 30, 1989 [JP] Japan ............................. 1-313863

[51] Int. Cl.⁵ ................... H01L 23/48; H01L 29/44; H01L 29/52; H01L 29/60
[52] U.S. Cl. ................... 257/758; 257/759; 257/760; 257/774; 257/765
[58] Field of Search ............ 357/71, 55, 65, 68, 357/71; 257/758, 759, 760, 774, 765, 781

[56] References Cited

U.S. PATENT DOCUMENTS 4,489,481 12/1984 Jones .
4,829,361 5/1989 Sagara et al. ............... 357/55
4,961,104 10/1990 Hirakawa .................. 257/774
4,975,760 12/1990 Dohjo et al. ............... 357/71
5,075,745 12/1991 Ino .......................... 357/55

FOREIGN PATENT DOCUMENTS 64-57717 3/1989 Japan .
0292116 5/1989 Japan .................... 257/758

Primary Examiner—Andrew J. James
Assistant Examiner—Carl Whitehead, Jr.
Attorney, Agent, or Firm—Lowe, Price, LeBlanc & Becker

[57] ABSTRACT

Disclosed is a method of manufacturing a semiconductor device in which an upper conductor layer and a lower conductor layer are electrically connected to each other through a contact hole provided in a multi-layer film. A lower conductor layer having a connection portion is formed on a semiconductor substrate. A first insulator film is formed on the semiconductor substrate to cover the lower conductor layer. On the first insulator film is formed a second insulator film having etching speed different from that of the first insulator film. An opening portion for exposing the connection portion is formed in the first and second insulator films. A native oxide film existing on the surface of the exposed opening portion is removed. An upper conductor layer is deposited on the second insulator film to fill the opening portion. According to this method, no projection which interrupts the step of forming the upper conductor layer is formed on the sidewall of the contact hole even if the native oxide film existing at the bottom surface of the contact hole is etched away. This results in an electrical connection between the upper and lower conductor layers in a satisfactory state.

2 Claims, 7 Drawing Sheets

SEMICONDUCTOR DEVICE HAVING MULTI-LAYER FILM STRUCTURE

This application is a continuation of application Ser. No. 07/578,986 filed Sep. 7, 1990 now abandoned.

BACKGROUND OF THE INVENTION

1. Field of the Invention

The present invention relates generally to semiconductor devices having multi-layer film structures, and more particularly to an improved semiconductor device of a multi-layer film structure in which a lower conductor layer and an upper conductor layer separated from each other by a multilayered insulator film are electrically connected to each other in a satisfactory state through a contact hole provided in the multilayered insulator film. This invention further relates to a method of manufacturing such a semiconductor device having a multi-layer film structure.

2. Description of the Background Art

Recently, high integration of semiconductor devices is remarkable, and a technique of forming a contact hole in a multi-layer film is required for such high integration.

FIG. 3A is a plan view of a conventional dynamic random access memory (DRAM) having a multi-layer film; and FIG. 3B is a cross sectional view taken along the lines IIIB—IIIB of FIG. 3A. Referring to these figures, the DRAM includes a semiconductor substrate 1 of the P-type. An isolating oxide film 2 for isolating device areas from each other is formed on a main surface of the semiconductor substrate 1. The DRAM shown in FIG. 3 basically includes transistors and stacked capacitors. Each of the transistors includes an N-type source/drain region 3 formed in the main surface of the semiconductor substrate 1, a transfer gate oxide film provided on the substrate 1, and a transfer gate 5. Meanwhile, each of the stacked capacitor includes a storage node 6, a capacitor dielectric film 7 provided on the storage node 6, and a cell plate electrode 8 provided on the capacitor dielectric film 7. The storage node 6 and the transfer gate 5 are isolated from each other by a first layer insulating film 9 between them. The layer insulating film 9 is formed of a silicon oxide film while the capacitor dielectric film 7 is formed, for example, of a silicon nitride film.

A second layer insulating film 10 is provided over an entire surface of the semiconductor substrate 1 including the transistors and stacked capacitors. The second layer insulating film 10 has a contact hole 11 formed therein which extends to the source/drain region 3. A bit line 12 extends through the contact hole 11 and is connected to the source/drain region 3. A third layer insulating film 13 is provided on the bit line 12. An aluminum wire 14 for carrying a signal to the transfer gate 5 is formed on the third layer insulating film 13. The aluminum wire 14 is made of an aluminum-silicon-copper alloy and formed by sputtering.

With the DRAM having such a construction as described above, when word lines are selected and a predetermined potential is applied to the transfer gate 5, the source/drain regions 3, 3 are rendered conductive to perform a reading/writing operation.

Subsequently, a structure of a contact portion between an aluminum wire 14 and a transfer gate 5 will be described.

FIG. 4 is a cross sectional view of a conventional structure of the contact portion between the aluminum wire and transfer gate, taken along the lines IV—IV of FIG. 3A.

Referring to FIG. 4, a multi-layer film 15 consisting of a first layer insulating film 9, an extension 7a of a capacitor dielectric film 7 and a second layer insulating film 10 is formed on a transfer gate 5. A contact hole 16 is formed in the multi-layer film 15, an aluminum wire 14 extends through the contact hole 16 and is connected to the transfer gate 5. The aluminum wire 14 is formed by sputtering as described hereinabove.

Now, referring to FIGS. 3A and 3B when the bit line 12 is to be connected to the source/drain region 3 by way of the contact hole 11, polycrystal silicon is placed into the contact hole 11 by chemical vapor deposition. Since such a chemical vapor deposition has a good coating property with respect to a sidewall face of the contact hole 11, there is no trouble in this instance.

However, referring to FIG. 4, when the aluminum wire 14 is to be connected to the transfer gate 5 by way of the contact hole 16, an aluminum-silicon-copper alloy is put into the contact hole 16 by sputtering. This sputtering provides a poor coating property for a sidewall face of the contact hole 16 and hence does not provide such an ideal structure as shown in FIG. 4. This method has such problems as described below with reference to the following figures.

FIGS. 5A to 5D are schedule views of conventional steps in forming a contact hole in a multi-layer film and are represented in sectional views.

Referring to FIG. 5A, a multi-layer film 15 is formed on a substrate 17. The multi-layer film 15 includes a lower film 18, an intermediate film 19 and an upper film 20. The substrate 17 is, for example, a silicon substrate or a wire (polycrystal silicon, an aluminum alloy or the like). The lower film 18 is a layer insulating film, for example, a silicon oxide film. The intermediate film 19 is an extension of a capacitor dielectric film, for example, a silicon nitride film. The upper film 20 is a layer insulating film, for example, a silicon oxide film.

Subsequently, referring to FIG. 5B, a resist film 21 is formed on the multi-layer film 15. After then, the resist film 21 is patterned so that an opening may be formed at a portion of the resist film 21 at which a contact hole is to be formed. After then, using the resist film 21 as a mask, the multi-layer film 15 consisting of the lower film 18, intermediate film 19 and lower film 20 is etched until a surface of the substrate 17 is exposed, thereby forming a contact hole 22. Formation of the contact hole 22 is carried out by etching the upper film 20, intermediate film 19 and lower film 18 at a stroke normally using plasma etching which presents a high anisotropic property. Where the anisotropic property is high, the selectivity in etching between a silicon oxide film (18, 20) and a silicon nitride film (19) is low, which allows a smooth etched face to be obtained. At this stage, a native oxide film 60 is produced at the bottom of the contact hole 22. After then, the resist film 21 is removed.

Then, after removal of the resist film 21, referring to FIG. 5C, the substrate 17 is immersed for a short period of time in dilute solution of hydrofluoric acid or ammonium fluoride to remove a very thin native oxide film 60 of scores angstroms which exists on a surface of the substrate 17. Such removing processing of a native oxide film is a step essential to improvement in ohmic property of a junction between the substrate 17 and an aluminum wire which is formed later. However, since the wet type removing processing of a natural oxide film is chemical etching, the selectivity in etching is high. Consequently, a phenomenon takes place that a silicon oxide film (18, 20) is etched while a silicon nitride film (19) remains not etched, and an eave-like projection 19a of the silicon nitride film (19) is produced on a sidewall face of the contact hole 22 as shown in the figure. If the aluminum wire 14 of an aluminum alloy or the like is formed by sputtering while such an eave-like projection 19a as described above remains present, referring to FIG. 5D, the aluminum wire 14 will not come around to a location below the eave-like projection 19a. As a result, the coating property of the aluminum wire 14 is deteriorated extremely on the sidewall face of the contact hole 22, and in a worst case, the aluminum wire 14 is disconnected at a portion thereof on the intermediate film 19 (silicon nitride film) as shown in the figure, thereby causing an imperfect conducting condition. Or else, even if disconnection does not take place, the thickness of the aluminum wire 14 is reduced at a portion thereof on the eave-like projection 19a, which makes a problem of reliability.

Further, with the conventional method, a problem sometimes takes place also when a contact hole is formed.

FIGS. 6A to 6E are schedule views of a process of forming a contact hole in a multi-layer film using both of wet etching and anisotropic etching.

Referring to FIG. 6A, a multi-layer film 15 is formed on a substrate 17. The multi-layer film 15 consists of a lower film 18, an intermediate film 19 and an upper film 20. The lower film 18 and the upper film 20 are, for example, silicon oxide films. The intermediate film 19 is, for example, a silicon nitride film.

Subsequently, referring to FIG. 6B, a resist film 21 is formed on the multi-layer film 15. Then, the resist film 21 is patterned so that an opening may be formed at a portion of the resist film 21 at which a contact hole is to be formed. Then, using the resist film 21 as a mask, isotropic etching of the multi-layer film 15 is carried out with etching liquid of hydrogen fluoride. The reason why wet etching is additionally used for the formation of a contact hole is that it is intended to shape an upper end portion of the contact hole into a tapered configuration. However, since such a wet etching is chemical etching, the selectivity in etching is high. Consequently, such a phenomenon takes place that a silicon oxide film (18, 20) is etched while a silicon nitride film (19) remains not etched, and an eave-like projection 19a of the silicon nitride film (19) is produced as shown in the figure. Then, referring to FIG. 6C, using the resist film 21 as a mask, anisotropic plasma etching is carried out to form a contact hole 22 which extends to the substrate 17.

After then, referring to FIG. 6D, if the resist film 21 is removed, then the contact hole 22 is obtained wherein the eave-like projection 19a of the silicon nitride film 19 is projected from a sidewall face of the contact hole 22.

If an aluminum wire 14 of an aluminum alloy or the like is formed by sputtering while such an eave-like projection 19a as described above remains present, then the aluminum wire 14 will not come around to a location below the eave-like projection 19a as shown in the figure. As a result, the coating property of the aluminum wire 14 is deteriorated extremely at the sidewall face of the contact hole 2, and in a worst case, the aluminum wire 14 is disconnected at a portion thereof on the silicon nitride film (19) as shown in the figure to cause an imperfect conducting condition. Or else, even if disconnection does not take place, the film thickness of the aluminum wire 14 is reduced at a portion thereof on the eave-like projection 19a, which makes a problem of reliability.

Further, while, in the conventional examples described above, the case is described wherein an intermediate film is projected as an eave-like projection from a wall face of a contact hole, referring to FIG. 7, when a spin on glass film (SOG film) having low density is used for an intermediate film 19, a phenomenon takes place that the intermediate film 19 recedes from a wall face of a contact hole 22 by etching before formation of an aluminum wire (etching for the removal of a native oxide film) so that a groove 19b in the form of a depression is produced on a sidewall of the contact hole 22. If an aluminum wire 14 is formed by sputtering while such a groove 19b in the form of a depression as described above remains present, then disconnection of the aluminum wire 14 takes place as shown in the figure. It is to be noted that, since members or elements denoted by reference numerals 14, 17, 18, 20 and 22 in FIG. 7 are quite the same as those described hereinabove with reference to FIG. 5D, description thereof will not be repeated.

The problem of disconnection of an aluminum wire in a contact hole described above will hereinafter be a progressively serious problem due to an increase of layers in a film arising from promotion of fine structures of semiconductor devices, a deterioration of the coating property of metal wiring films arising from an increase of the aspect ratio of contact holes, and so forth.

In order to solve such problems as described above, Japanese Patent Laying-Open No. 64-57717 discloses a technique of protecting a sidewall face of a contact hole with a polycrystal silicon film.

In particular, referring to FIG. 8, a multi-layer film 15 is formed on a substrate 17. The multi-layer film 15 consists of an upper film 23 and a lower film 24. The multi-layer film 15 has a contact hole 22 formed therein which extends to the substrate 17. A polycrystal silicon film 25 is formed in such a manner as to cover a sidewall face of the contact hole 22. Such a construction as described above prevents formation of such an eave-like projection or a groove in the form of a depression as described above. However, the method has the following problems.

In particular, when the multi-layer film 15 is etched to form the contact hole 22, the surface of the substrate 17 is acted upon by an impact energy upon etching. Further, since the polycrystal silicon 25 is formed on the sidewall face of the contact hole 22, the surface of the substrate 17 is acted upon again by an impact energy upon etching. Since the surface of the substrate 17 is acted upon by an impact energy twice, there is a problem that the substrate 17 is damaged to cause leak current.

Further, there is a problem that there remains a polycrystal silicon film as a residue during etching of the polycrystalline silicon on the bottom of the contact hole 22 and consequently an ohmic junction cannot be obtained between the aluminum wire 14 and the substrate 17.

In addition, according to the method, a polycrystal silicon film is deposited on the substrate 17 using chemical vapor deposition and is then dry etched to form a polycrystal silicon film 25 on the sidewall face of the contact hole 22. Upon such dry etching, fragments of polycrystal silicon are scattered as foreign particles and stick to every portion of the semiconductor device. Accordingly, there is a problem that such polycrystal silicon fragments may make a cause of short-circuiting between wires.

SUMMARY OF THE INVENTION

An object of the present invention is therefore to improve a semiconductor device having a multi-layer film structure in which a lower conductor layer and an upper conductor layer separated by a multilayered insulator film are connected to each other through a contact hole provided in the insulator film so that the lower and upper conductor layers can be connected in a satisfactory state.

Another object of the present invention is to improve a dynamic random access memory having a multi-layer film structure in which a lower conductor layer and an upper conductor layer separated by a multilayered insulator film are connected to each other through a contact hole provided in the insulator film so that the lower upper conductor layers can be connected in a satisfactory state.

A further object of the present invention is to improve a method of manufacturing a semiconductor device having a multi-layer film structure in which a lower conductor layer and an upper conductor layer separated by a multilayered insulator film are connected to each other through a contact hole provided in the insulator film so that the lower and upper conductor layers can be connected in a satisfactory state.

A still further object of the present invention is to improve a method of manufacturing a semiconductor device having a multi-layer film structure so that a substrate may be less damaged in formation of a contact hole.

A semiconductor device according to the present invention is directed to a semiconductor device having a multi-layer film structure in which a lower conductor layer and an upper conductor layer separated by a multilayered insulator film are connected to each other through a contact hole provided in the insulator film. The semiconductor device includes a substrate and a lower conductor layer provided on the substrate and having a connection portion. A first insulator film having a first opening portion for exposing the connection portion is provided on the lower conductor layer. A second insulator film having etching speed different from that of the first insulator film is provided on the first insulator film. The second insulator film includes a second opening portion having a larger diameter than that of the first opening portion for exposing the first opening portion. The semiconductor device further includes an upper conductor layer provided on the substrate having the first and second insulator films so as to fill the first and second opening portions and electrically connected to the lower conductor layer.

In accordance with the semiconductor device having the multi-layer film structure according to the present invention, a step-like projection existing at the bottom of the contact hole facilitates the filling of the upper conductor layer in the contact hole, thereby connecting the upper and lower connector layers in a satisfactory state.

A method according to another aspect of the present invention is directed to a method of manufacturing a semiconductor device having a multi-layer film structure in which a lower conductor layer and an upper conductor layer separated by a multilayered insulator film are connected to each other through a contact hole provided in the insulator film. First, a lower conductor layer having a connection portion is formed on a semiconductor substrate. A first insulator film is then formed on the semiconductor substrate including the lower conductor layer. A second insulator film having etching speed different from that of the first insulator film is formed on the first insulator film. An opening portion for exposing the connection portion is formed in the first and second insulator films. A native oxide film existing at the surface of the exposed connection portion is then removed. The upper conductor layer is deposited on the second insulator film to fill the opening portion.

In accordance with the method of manufacturing the semiconductor device having the multi-layer film structure according to another aspect of the present invention, a step-like projection produced at the bottom of the contact hole facilitates the filling of the upper conductor layer in the contact hole, thereby connecting the upper and lower conductor layers in a satisfactory state.

In addition, since an etching for forming the contact hole extending to the substrate (an etching of striking the bottom wall of the contact hole) need be carried out just once, a possible damage to the substrate is small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the figures.

Figure 1:
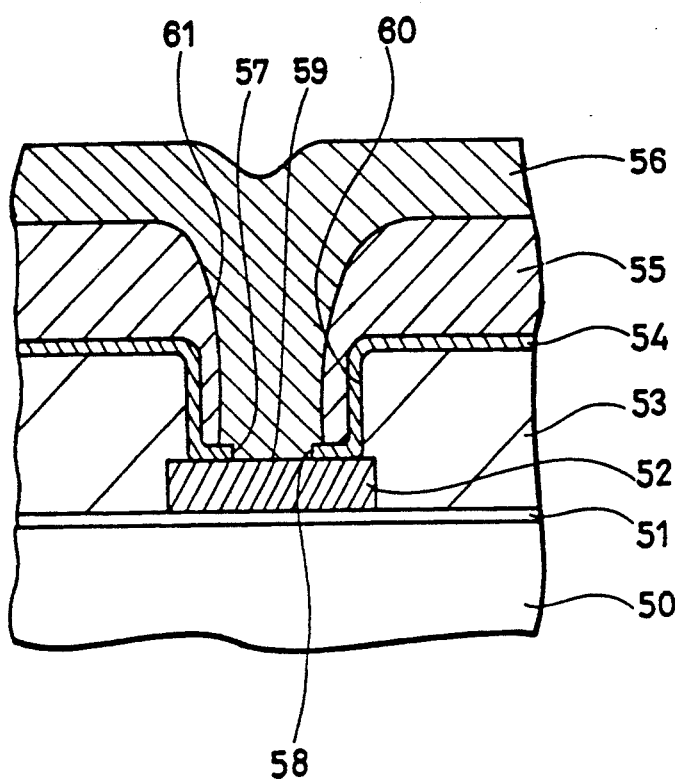
FIG. 1 is a sectional view of a contact portion of a semiconductor device of a multi-layer film structure according to an embodiment of the present invention.

Referring to FIG. 1, a transfer gate oxide film 51 is provided on a semiconductor substrate 50. A lower conductor layer 52 serving as a transfer gate is provided on the transfer gate oxide film 51. The lower conductor layer 52 has a connection portion 59. A third insulator film 53 is formed on the semiconductor substrate 50 to cover the lower conductor layer 52. The third insulator film 53 is an interlayer insulation film, for example, a silicon oxide film. In the third insulator film 53 is formed a third opening portion 60 for exposing the connection portion 59 and having a larger diameter than that of the connection portion 59.

A first insulator film 54 which is an extension of a capacitor dielectric film (e.g., a silicon nitride film) is formed on the third insulator film 53. The first insulator film 54 is provided to cover the sidewall surface and bottom surface of the third opening portion 60. A first opening portion 58 for exposing the connection portion 59 is provided in the first insulator film 54. A second insulator film 55 is formed on the semiconductor substrate 50 to fill the first opening portion 58 and cover the first insulator film 54. The second insulator film 55 is an interlayer insulation film, for example, a silicon oxide film. In the second insulator film 55 is formed a second opening portion 61 called a contact hole for exposing the connection portion 59 and having a larger diameter than that of the first opening portion 58. An upper conductor layer 56 being an aluminum interconnection layer is formed on the second insulator film 55 to fill the second opening portion 61. The upper conductor layer 56 is electrically connected to the lower conductor layer 52.

In accordance with this device, since a step-like projection 57 exists at the bottom surface of the second opening portion 61, the upper conductor layer 56 becomes easily filled in the second opening portion 61. Thus, the upper conductor layer 56 and lower conductor layer 52 are connected to each other in a satisfactory state.

FIGS. 2A-2F are sectional views showing the processing steps for manufacturing the semiconductor device shown in FIG. 1. Referring to this figure, the transfer gate oxide film 51 is formed on the semiconductor substrate 50. On the transfer gate oxide film 51 is then formed the lower conductor layer 52 being a transfer gate. The third insulator film 53 is then formed on the semiconductor substrate 50 to cover the lower conductor layer 52. A resist film 62 is formed on the third insulator film 53. The resist film 62 is patterned, thereby forming the third opening portion 60 having a larger diameter than that of the connection portion 59 in the resist film 62. The diameter of the third opening portion 60 is selected to be 3μm when the diameter of the connection portion 59 is, for example, 2μm. Thereafter, the third insulator film 53 is etched by plasma etching employing $CF_4$ with the patterned resist film 62 used as mask. Accordingly, the third opening portion 60 having a larger diameter than that of the connection portion 59 is formed in the third insulator film 53. The resist film 62 is thereafter removed.

Figure 2A:
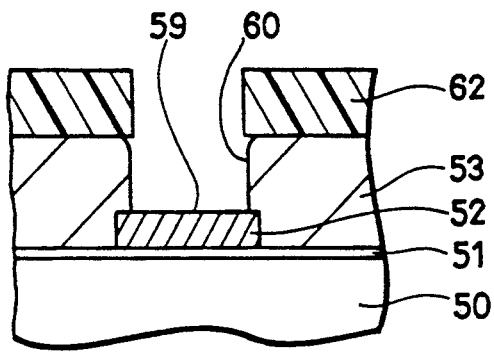
FIGS. 2A to 2F are schedule views represented in sectional views illustrating a process of producing a semiconductor device of a multi-layer film structure having a contact hole according to another embodiment of the present invention.
Figure 2B:
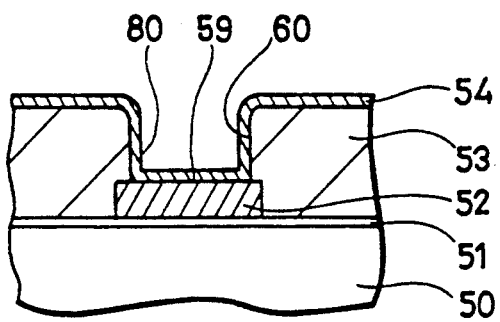

Referring to FIG. 2B, the first insulator film 54 is formed to cover a sidewall and bottom surface which define the third opening portion 60. This results in formation of a concave portion 80. The first insulator film 54 is, for example, an extension of a capacitor dielectric film.

Figure 2C:
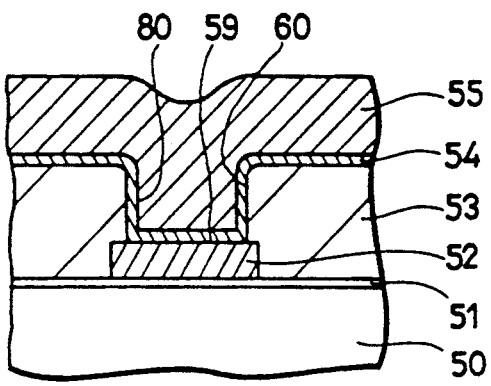

Then, referring to FIG. 2C, the second insulator film 55 is formed on the first insulator film 54 to be filled in the concave portion 80.

Figure 2D:
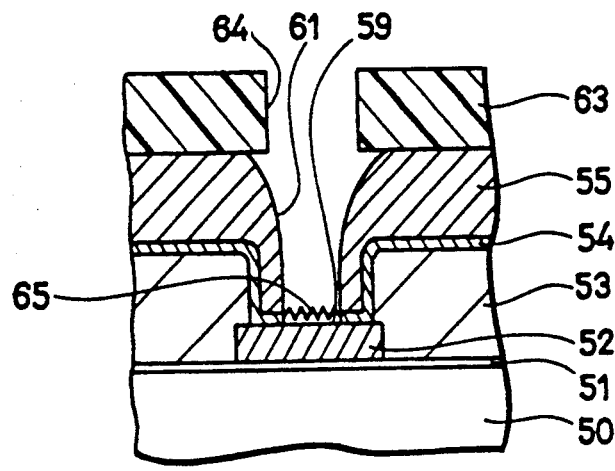

Referring to FIG. 2D, a resist film 63 is then formed on the second insulator film 55. Thereafter, the resist film 63 is patterned to form an opening portion 64 therein. The second insulator film 55 and the first insulator film 54 are then etched at a time by highly anisotropical plasma etching, with the patterned resist film 63 used as mask. This causes the second opening portion 61 called a contact hole for exposing the connection portion 59 to be formed in the second insulator film 55. A native oxide film 65 is formed at the surface of the connection portion 59 at this time, and thereafter the resist film 63 is removed.

Figure 2E:
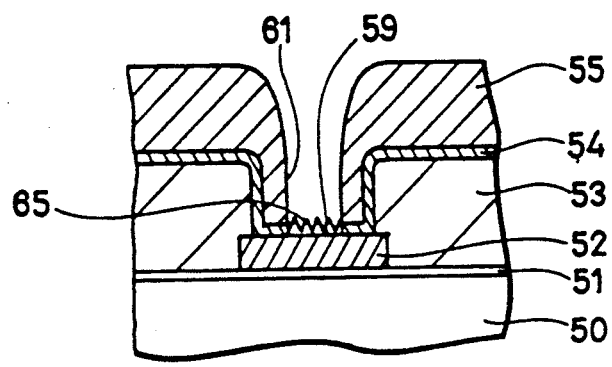

As shown in FIG. 2E, the semiconductor substrate 50 is immersed for a short period of time in a dilute solution of hydrofluoric acid or ammonium fluoride to remove a very thin native oxide film 65 of scores Å which exists on the surface of the connection portion 59.

Figure 2F:
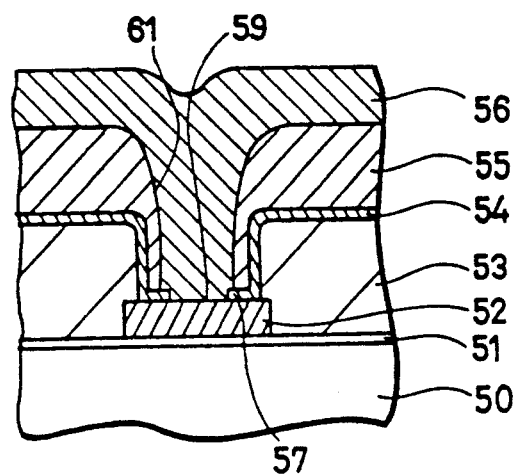
Figure 3A:
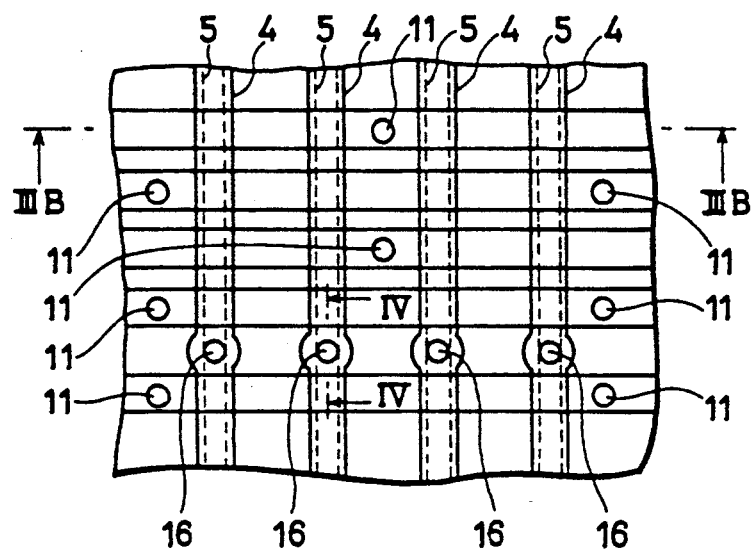
FIG. 3A is a plan view of a conventional dynamic random access memory having a multi-layer film.
Figure 3B:
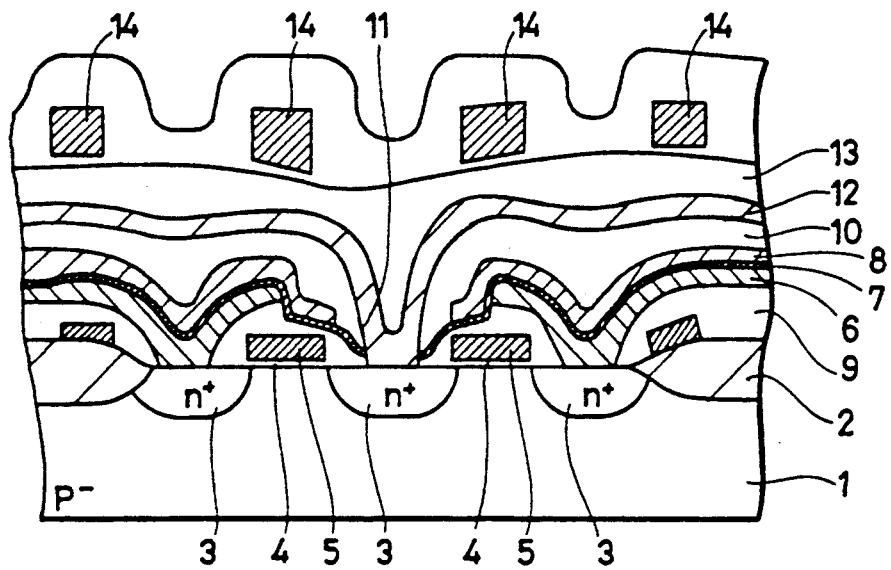
FIG. 3B is a sectional view taken along the lines IIIB—IIIB of FIG. 3A.
Figure 4:
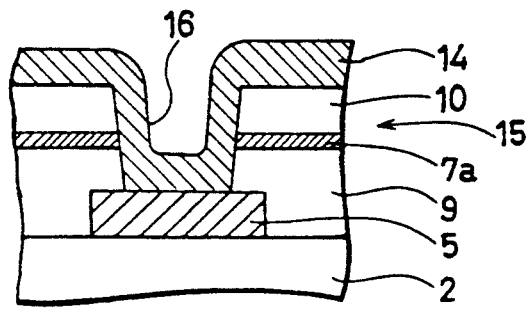
FIG. 4 is a sectional view of a conventional structure of a contact portion between an aluminum wire and a transfer gate, taken along the lines IV—IV of FIG. 3A.
Figure 5A:
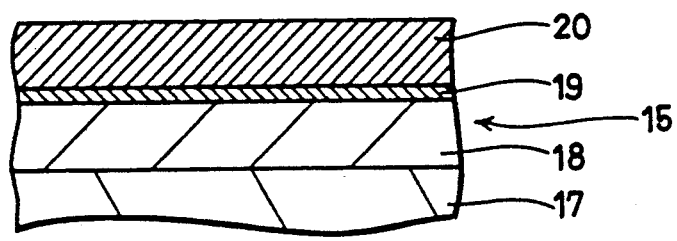
FIGS. 5A to 5D are sectional views illustrating a conventional process of forming a contact hole in a conventional semiconductor device having a multi-layer film structure in the order of steps.
Figure 5B:
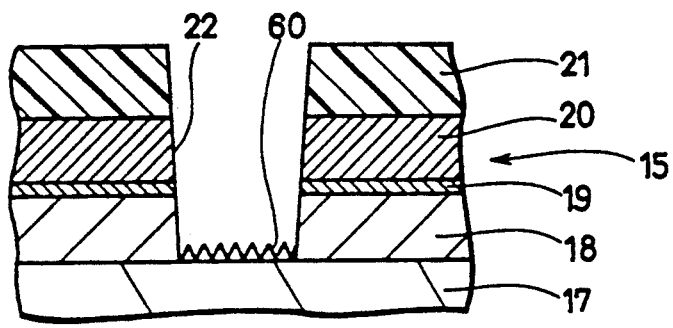
Figure 5C:
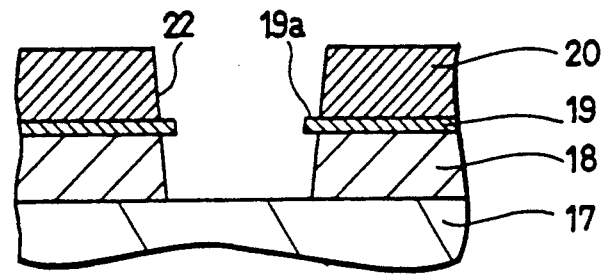
Figure 5D:
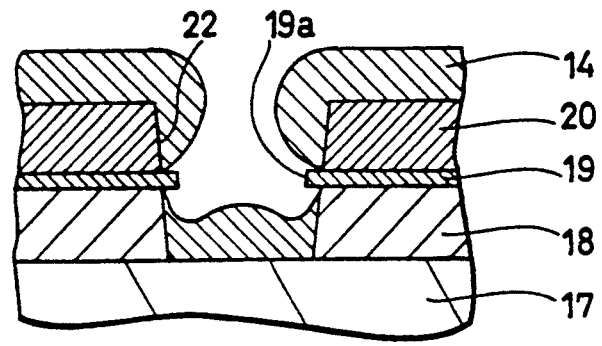
Figure 6A:
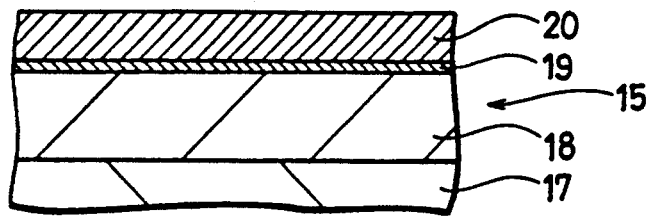
FIGS. 6A to 6E are schedule views illustrating another conventional example of forming a contact hole in a semiconductor device of a multi-layer film structure.
Figure 6B:
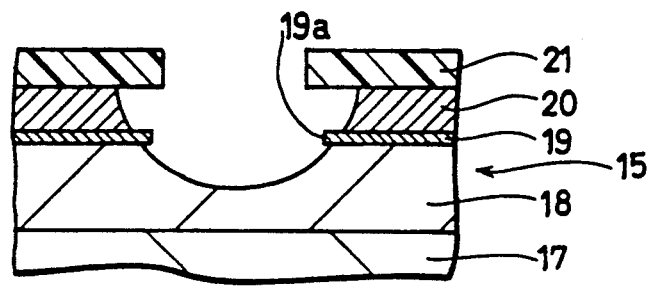
Figure 6C:
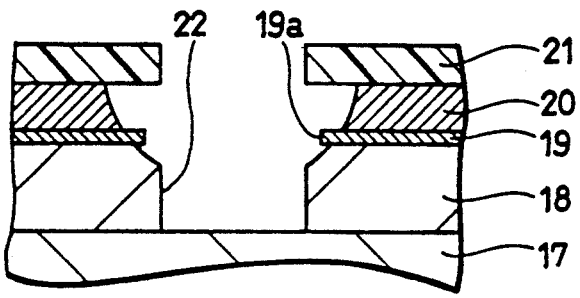
Figure 6D:
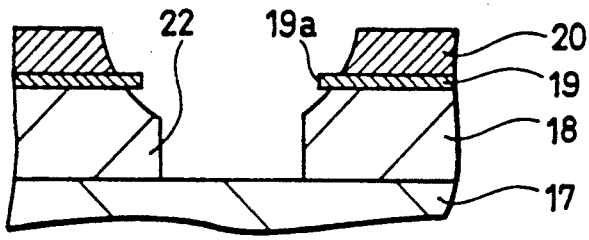
Figure 6E:
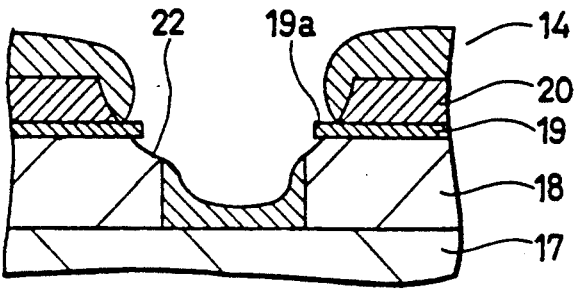
Figure 7:
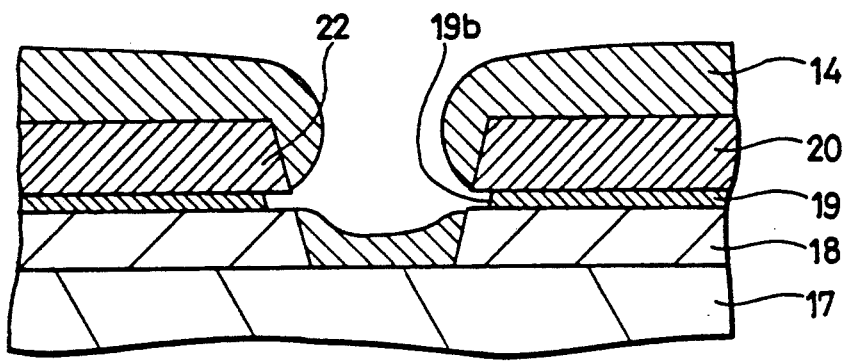
FIG. 7 is a sectional view illustrating a problem when a contact hole is formed in a semiconductor device of a multi-layer film structure having a SOG film.
Figure 8:
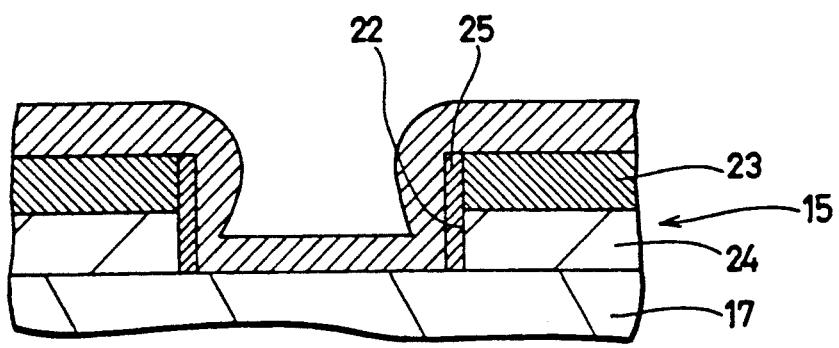
FIG. 8 is a sectional view of a contact portion of a conventional semiconductor device wherein a sidewall of a contact hole is protected with a polycrystal silicon film.

At this time, as shown in FIG. 2F, the sidewall of the second opening portion 61 is also etched more or less and then recedes backward. During the etching, the first insulator film 54 is not subjected to the etching by the solution of hydrofluoric acid or ammonium fluoride since it is a silicon nitride film. This results in formation of a step-like projection 66 at the bottom of the second opening portion 61. Since this step-like projection 66 is formed at the bottom of the second opening portion 61, it does not interrupt the next processing step of forming the upper conductor layer 56 by sputtering (which is carried out by sputtering an aluminum-silicon-copper alloy). Consequently, the upper conductor layer 56 is filled in the second opening portion 61 in a satisfactory state. Further, the step-like projection 57 contributes to enhancement of adhesion between the bottom portion of the second opening portion 61 and the upper conductor layer 56.

Also, in this embodiment, an etching for forming the second opening portion 61 (contact hole) extending to the connection portion 59 of the lower conductor layer 52 (i,e, an etching of striking the bottom surface of the contact hole) need be carried out just once, thereby causing less damage in the lower conductor layer 52.

While the silicon nitride film is shown as the first insulator film 54 by way of example in the above described embodiment, the present invention is not limited to this, and similar effects to those of the embodiment are exhibited even with an SOG film.

Moreover, while the semiconductor device having a triple-layer film structure is taken as an example in the above-described embodiment, a semiconductor device having a multi-layer film such as of four layers or more may be employed.

As has been described, in accordance with the semiconductor device of multi-layer film structure according to the present invention, the step-like projection existing at the bottom surface of the contact hole results in the enhancement of adhesion between the upper conductor layer and the bottom surface of the contact hole. As a result, such an effect is provided that the upper and lower conductor layers are electrically connected to each other in a satisfactory state.

In accordance with the method of manufacturing the semiconductor device having multi-layer film structure according to another aspect of the present invention, no projection which interrupts the step of aluminum interconnection is formed on the sidewall of the contact hole even though the native oxide film existing at the bottom surface of the contact hole is etched away. Consequently, the upper and lower conductor layers are electrically connected in a satisfactory state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a multi-layer film structure comprising:
    a substrate having a major surface;
    a first conductor layer on said surface;
    a first insulator film at a level generally parallel to and separated a predetermined distance from said surface;
    a second insulator film on sad first insulator film; and
    a second conductor layer on said second insulator film; wherein
    said first insulator film includes a portion extending from said level to contact said first conductor layer with an outer diameter defining a connection hole of electrically connecting said second conductor layer to said first conductor layer, said portion having an inner diameter exposing said first conductor layer to said connection hole;
    said second insulator film extends within said connection hole and includes an inner diameter larger than said inner diameter of the first insulator film portion; and
    said second conductor layer extends within said inner diameter of said second insulator film to connect with said first conductor layer.

2. The semiconductor device according to claim 1, wherein said first conductor layer is a gate electrode.

* * * * *